United States Patent
Na et al.

(10) Patent No.: US 6,849,506 B2
(45) Date of Patent: Feb. 1, 2005

(54) NON-VOLATILE MEMORY DEVICE AND FABRICATION METHOD

(75) Inventors: Kee Yeol Na, Chungcheongbuk-do (KR); Wook Hyun Kwon, Chungcheongbuk-do (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 10/659,351

(22) Filed: Sep. 11, 2003

(65) Prior Publication Data

US 2004/0048432 A1 Mar. 11, 2004

Related U.S. Application Data

(62) Division of application No. 09/873,226, filed on Jun. 5, 2001, now Pat. No. 6,649,967.

(30) Foreign Application Priority Data

Jul. 19, 2000 (KR) .......................................... 2000-41385

(51) Int. Cl.⁷ ............................................ H01L 21/336
(52) U.S. Cl. ........................ 438/264; 438/257; 438/263

(58) Field of Search ................................. 438/264, 263, 438/257, 201, 211, 266

(56) References Cited

U.S. PATENT DOCUMENTS

| | | |
|---|---|---|
| 5,045,488 A | 9/1991 | Yeh |
| 5,780,892 A | 7/1998 | Chen |
| 6,130,132 A | 10/2000 | Hsieh et al. |
| 6,200,864 B1 | 3/2001 | Selcuk |
| 6,368,976 B1 | 4/2002 | Yamada |
| 6,414,350 B1 | 7/2002 | Hsieh et al. |
| 2001/0016385 A1 | 8/2001 | Chiang et al. |

*Primary Examiner*—Eddie Lee
*Assistant Examiner*—Douglas W. Owens
(74) *Attorney, Agent, or Firm*—Birch, Stewart, Kolasch, Birch, LLP

(57) ABSTRACT

A non-volatile memory device includes a floating gate formed over a semiconductor substrate. At one end of the floating gate, there is a tapered protrusion having a horn-like or bird's beak shape. A control gate covers the floating gate except for the tapered protrusion. Sidewall spacers are formed adjacent to the floating gate and the control gate. An erasing gate is formed over the tapered protrusion of the floating gate.

11 Claims, 12 Drawing Sheets

NON-VOLATILE MEMORY DEVICE AND FABRICATION METHOD

This is a Divisional Application of application Ser. No. 09/873,226 filed on Jun. 5, 2001, now U.S. Pat. No. 6,649,967, the entire contents of which are hereby incorporated by reference.

BACKGROUND OF THE INVENTION

1. Field of Invention

The present invention relates to a non-volatile memory device, more particularly to a non-volatile memory device having a short erasing time and high reliability, and a fabrication method of the same.

2. Discussion of the Related Art

Generally, a non-volatile memory device is a memory device whose threshold voltage is changed according to the charging or discharging of a floating gate that is electrically insulated.

A programming operation of a conventional non-volatile memory device is performed by a channel hot electron (CHE) method in which hot electrons generated in a drain region when the device is operated in its saturation state are injected into the floating gate through a gate oxide film. An erasing operation is performed by emitting electrons from a floating gate into a channel or a gate oxide film of an overlapped region between a source and the floating gate. In order to perform the erasing operation by using the gate oxide film, the gate oxide film has to be very thin (less than 100 Å), yet it is very difficult to obtain a highly reliable fabrication of thin gate oxide film.

To improve the reliability of the gate oxide film, a method for emitting charges of the floating gate by using an additional erasing gate has been introduced. In most conventional devices using the additional erasing gate, since polysilicon is used for an oxide film of the floating gate, the oxide film of the floating gate is thicker than the gate oxide film of the channel region and the fabrication process thereof is relatively easy. However, the erasing method using the erasing gate requires a high voltage because of the thick oxide film of the floating gate. Furthermore, in a read operation, electrons are undesirably injected into the floating gate from the erasing gate, causing a threshold voltage of the device to be undesirably changed.

FIG. 1a is a cross sectional view showing a structure of a simple stacked non-volatile memory device of the conventional art, and FIG. 1b is a symbolic structure of the non-volatile memory device cell of the conventional art.

Referring to FIG. 1a, a tunneling insulation film 2 is formed on a p-type semiconductor substrate 1 and a floating gate 3 is formed on the tunneling insulation film 2. A dielectric layer 4 is formed on the floating gate 3 and a control gate 5 is formed on the dielectric layer 4. In surfaces of the p-type substrate 1 at both sides of the floating gate 3, n-type source region 6a and n-type drain region 6b are formed, respectively.

An effective cell size of a simple stack non-volatile memory device having a structure of FIG. 1a is small, but a coupling constant of the control gate 5 also becomes undesirably small. Furthermore, a serious problem is that the coupling constant becomes smaller as the effective cell size becomes smaller. Therefore, in order to prevent the coupling constant from becoming smaller, several attempts of forming an O—N—O (oxide-nitride-oxide) film as the dielectric film 4 between the floating gate 3 and the control gate 5 have been made, but the overall process for forming the O—N—O film is complex and a high annealing process is required.

As shown in FIG. 1a and FIG. 1b, a non-volatile memory cell includes a floating gate 3, a control gate 5 for controlling the amount of charges supplied to the floating gate 3 for programming (e.g., data write) operation, and a field effect transistor is used for reading (or verifying) the amount of charges carrier provided to the floating gate 3 during the programming operation. The field effect transistor includes the floating gate 3, the source 6a, the drain 6b, and channel 7 between the drain 6b and the source 6a.

The conventional art non-volatile memory cell constructed as described above is operated by the current between the drain 6b and the source 6a when the control gate 5 and the drain 6b are driven by voltages that are high enough to guarantee the operation of the cell. At this time, the current between the drain 6b and the source 6a is compared with a reference current. If the current is equal to or less than the reference current, a programming completion signal is generated. A conventional non-volatile memory device and the fabrication method of the same will be explained as follows.

FIG. 2 is a cross sectional view showing the structure of a conventional non-volatile memory device. As shown in FIG. 2, the conventional non-volatile memory device comprises a first floating gate 13 formed on an insulation film 12 which is formed on a predetermined portion of a p-type semiconductor substrate 11; a first insulation film 14 formed on an entire surface of the substrate 11 including the first floating gate 13, with a contact hole to expose a predetermined portion of the first floating gate 13; a second floating gate 16a formed in the contact hole and on the first insulation film 14 adjacent to the contact hole; a second insulation film 17, a control gate 18a and a cap insulator 19 being sequentially stacked so as to have an alignment with one side of the second floating gate 16a and exposed surface of the other side of the second floating gate 16a; a third insulation film sidewall 21 formed at both sides of the cap insulator 19, the control gate 18a and the second insulation film 17; a tunneling insulation film 22 formed on the exposed surface of the second floating gate 16a; and an erasing gate 23 formed adjacent to the tunneling insulation film 22.

FIG. 3a to FIG. 3g are cross sectional views showing the fabrication process for the conventional non-volatile memory device.

As shown in FIG. 3a, a gate insulation film 12 is formed on a p-type semiconductor substrate 11. A first polysilicon layer for a floating gate is formed on the gate insulation film 12. By selectively removing the first polysilicon layer by a photolithography process, the first floating gate 13 having a predetermined size is formed. The first floating gate 13 is formed as an island shape by patterning the first polysilicon layer in a column direction by the photolithography process and then patterning the patterned polysilicon layer in the direction perpendicular to the column direction by photolithography process. At both sides of the first floating gate 13, insulation sidewalls (not shown in FIG. 3a) are formed and electrically insulate the first floating gate 13. Impurity ions of different conductivity type from the semiconductor substrate 11 are injected into the surface regions of the semiconductor substrate 11 at both sides of the first floating gate 13. These regions are used as a source region and a drain region (not shown in FIG. 3a), respectively.

As shown in FIG. 3b, on the entire surface of the semiconductor substrate 11 including the first floating gate 13, a first insulation film 14 composed of oxide film, nitride film/oxide film using low pressure chemical vapor deposition (LPCVD), or their combination is formed. A contact hole 15 is formed by selectively removing a portion of the first insulation film 14 by a photolithography process so that a predetermined portion of the top surface of the first floating gate 13 is exposed.

As shown in FIG. 3c, a second polysilicon layer 16 for a second floating gate is formed over the entire surface of the semiconductor substrate 11 including the contact hole 15. In this case, in order to form the second polysilicon layer 16, a doped polysilicon layer may be used or an undoped polysilicon layer may be deposited first and then doped by ion injection method or diffusion source doping method.

Over the entire surface of the semiconductor substrate 11 including the second polysilicon layer 16, a second insulation film 17 of 100~500 Å thickness composed of a silicon oxide film or a combination of LPCVD oxide film and silicon nitride film is formed. Subsequently, a third polysilicon layer 18 for a control gate is formed on the second insulation film 17. A cap insulation film composed of an oxide film, a nitride film or a combination of the oxide film and the nitride film is formed on the third polysilicon film 18. And then, the cap insulation film is selectively removed by photolithography process to form a cap insulator 19.

As shown in FIG. 3d, a photoresist 20 is formed over the entire surface of the semiconductor substrate 11 including the cap insulator 19. Thereafter, the photoresist 20 is patterned by exposing and developing process. By using the patterned photoresist 20 and the cap insulator 19 as a mask, the third polysilicon layer 18 is selectively removed, and therefrom a control gate 18a is formed.

Thereafter, as shown in FIG. 3e, the photoresist 20 is removed. Then, a blank etching is performed using the cap insulator 19 as a mask. Portions of the second insulation film 17 and the second polysilicon layer 16 are selectively removed by blank etching, so that a second floating gate 16a is formed. More particularly, a part of the control gate 18a not covered by the cap insulator 19 is selectively removed and at the same time, the second insulation film 17 under the exposed part of the control gate 18a is also removed. Thus, the control gate 18a and the second insulation film 17 are formed to have the same width, and the second floating gate 16a is formed to have the original width of the control gate 18a depicted in FIG. 3d.

As the result, one side of the second floating gate 16a is aligned with the second insulation film 17, the control gate 18a and the cap insulator 19. Portions of the other side of the second floating gate 16a is exposed outwardly.

As shown in FIG. 3f, a third insulation film such as an oxide film is formed over the entire surface of the semiconductor substrate 11 including the cap insulator 19 and then an etch back process is performed, so that third insulation film sidewalls 21 are formed on both sides of the cap insulator 19, the control gate 18a and the second floating gate 16a. Subsequently, a thermal oxidation process is performed over the semiconductor substrate 11 to grow a tunneling insulation film 22 on a surface of the second floating gate 16a not being covered by the control gate 18a.

As shown FIG. 3g, a third polysilicon layer is formed over the semiconductor substrate 11 and selectively removed by a photolithography process to form an erasing gate 23 adjacent to the tunneling insulation film 22. The erasing gate 23 is patterned in the same direction as the control gate 18a, and then the memory device is completed by using a general process such as a contact and wiring process.

However, the conventional non-volatile memory device and the fabrication method of the memory device have the following problems.

First, when the non-volatile memory device having an erasing gate performs an erase operation, a high voltage is required to make electrons tunnel into the tunneling insulation film 22. Second, when a read operation is performed in the non-volatile memory device, undesired electrons flow into the floating gate from the erasing gate and as a result, a threshold voltage of the non-volatile memory device is increased.

The present invention is directed to solve the aforementioned problems and provide a non-volatile memory device and its fabrication method allowing the device to have a short erasing time and high reliability.

Additional features and advantages of the invention will be set forth in the description that follows, and in part will be apparent from the description, or may be learned by practice of the invention. Other advantages of the invention will be realized and attained by the structure particularly pointed out in the written description and claims hereof as well as the appended drawings.

SUMMARY OF THE INVENTION

To achieve these and other advantages in accordance with the present invention, as embodied and broadly described, a non-volatile memory device in accordance with the present invention comprises a floating gate formed over a semiconductor substrate so as to have one horn-like edge portion, a control gate formed over the floating gate except for the horn-like edge portion, sidewall spacers composed of an oxidation resist insulation film and formed on both sides of the control gate and the floating gate, a horn-like tunneling insulation film on the horn-like edge portion of the floating gate, and an erasing gate formed on the tunneling insulation film.

A fabrication method of the non-volatile memory device in accordance with the present invention comprises the step of forming a floating gate over a semiconductor substrate, the step of forming a control gate over the floating gate so that the control gate is aligned with a first portion of the floating gate and a surface of a second portion of the floating gate is not covered by the control gate, the step of forming sidewall spacers composed of oxidation resist insulation film on both sides of the control gate and the floating gate, the step of forming a horn-like tunneling insulation film on the exposed surface of the floating gate and at the same time, forming a horn-like edge of the second portion of the floating gate, and the step of forming an erasing gate on the tunneling insulation film.

It is to be understood that both the foregoing general description and the following detailed description are exemplary and explanatory, and are intended to provide further explanation of the invention as claimed.

DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
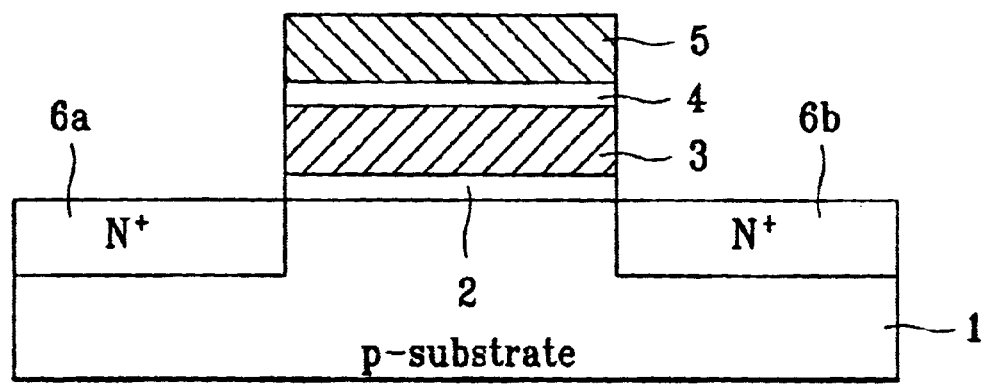
FIG. 1a is a cross sectional view showing a conventional simple stack nonvolatile memory device.
Figure 1B:
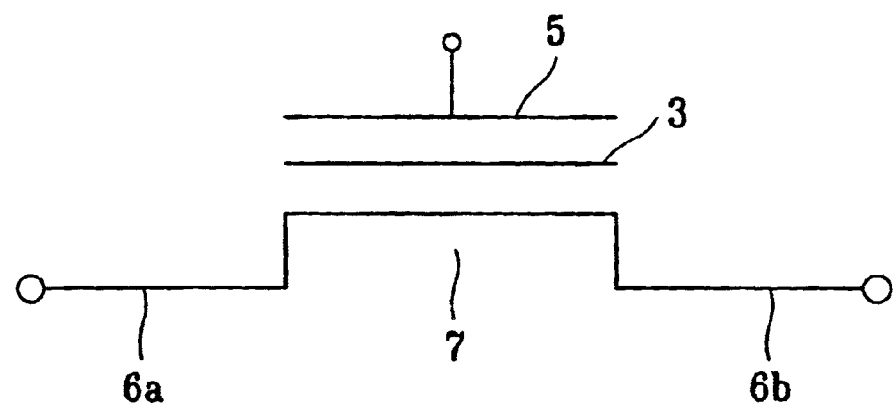
FIG. 1b shows a symbolic structure of a conventional non-volatile memory device.
Figure 2:
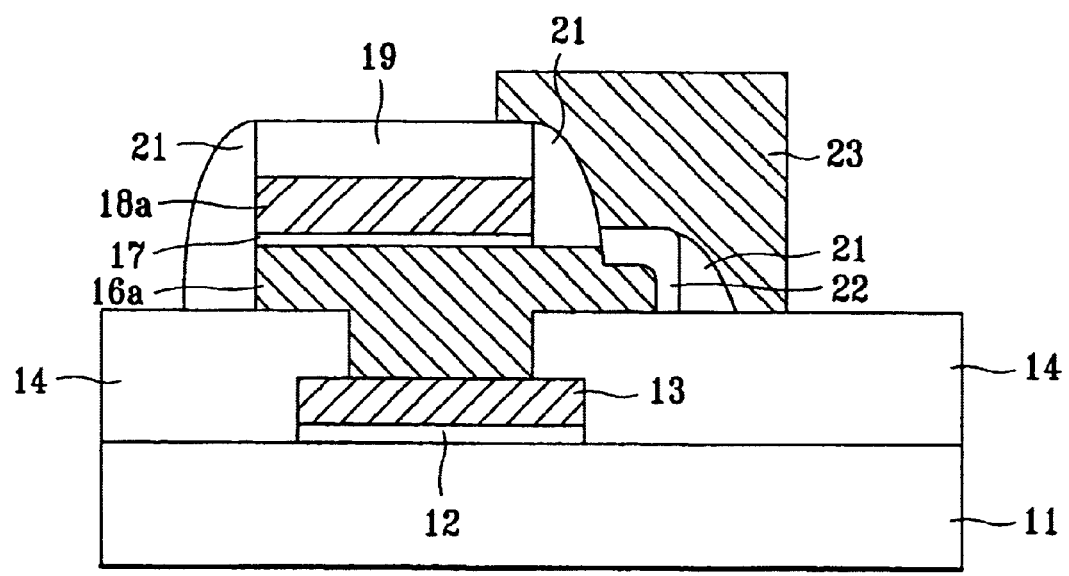
FIG. 2 is a cross sectional view showing the structure of a conventional non-volatile memory device.
Figure 3A:
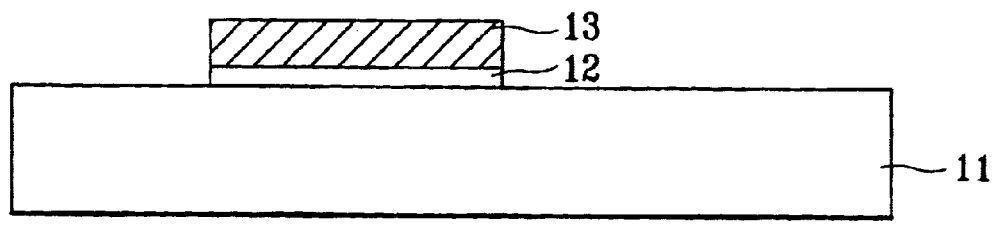
FIG. 3a to FIG. 3g are cross sectional views showing the fabrication method of the conventional non-volatile memory device.
Figure 3B:
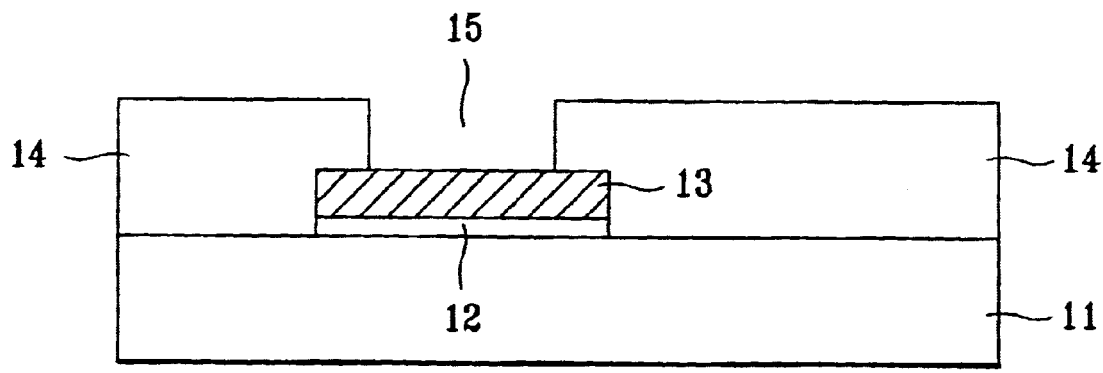
Figure 3C:
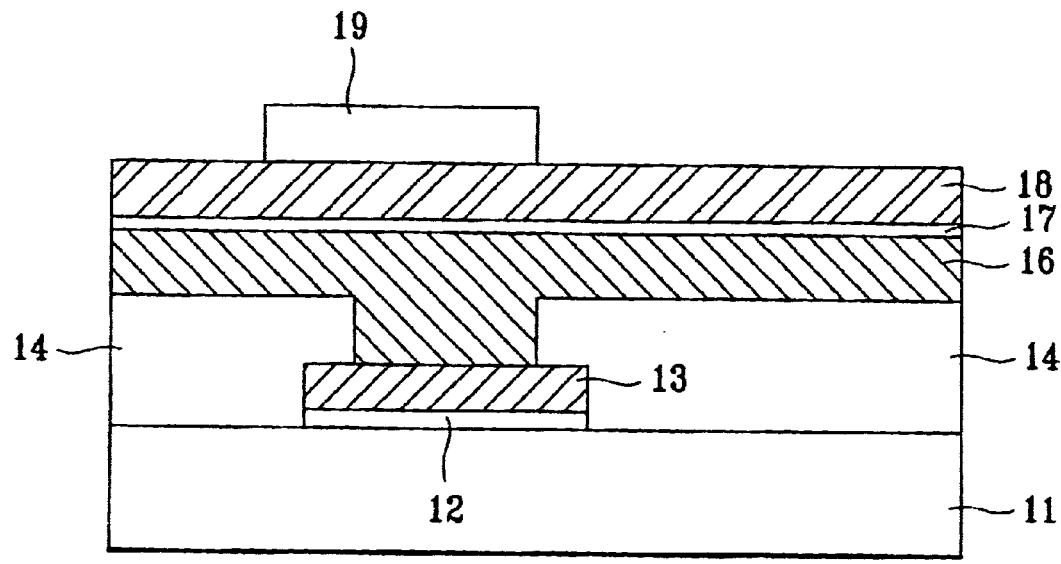
Figure 3D:
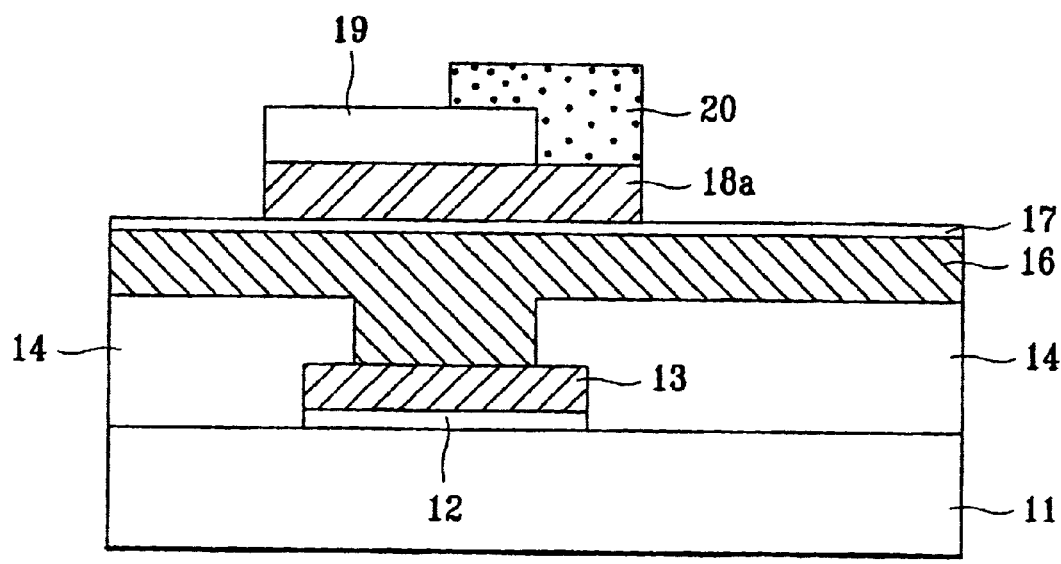
Figure 3E:
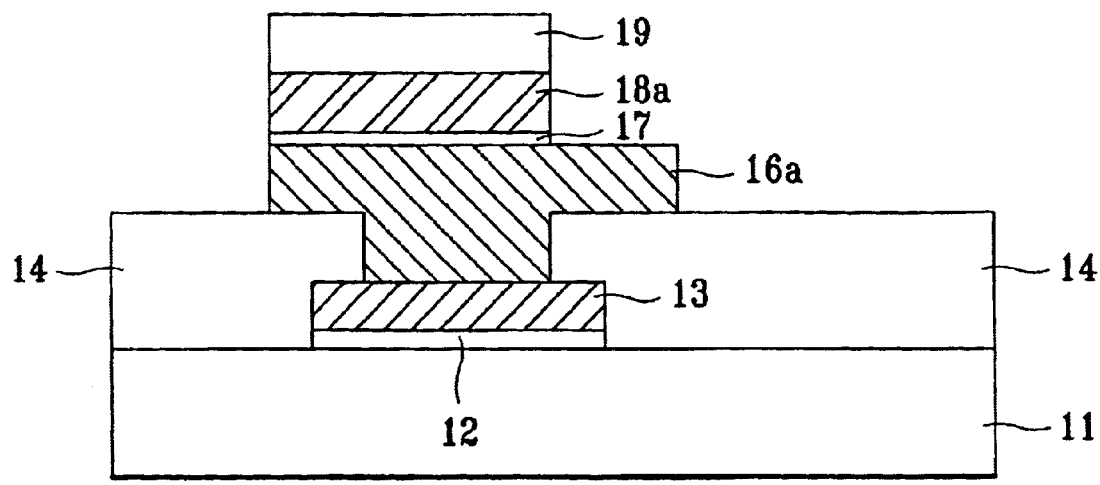
Figure 3F:
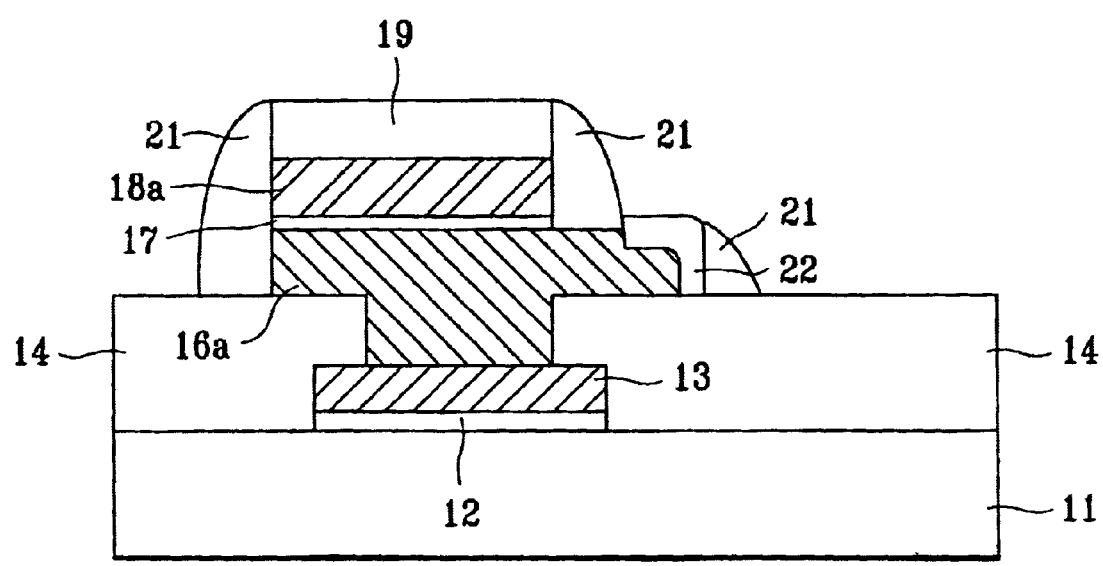
Figure 3G:
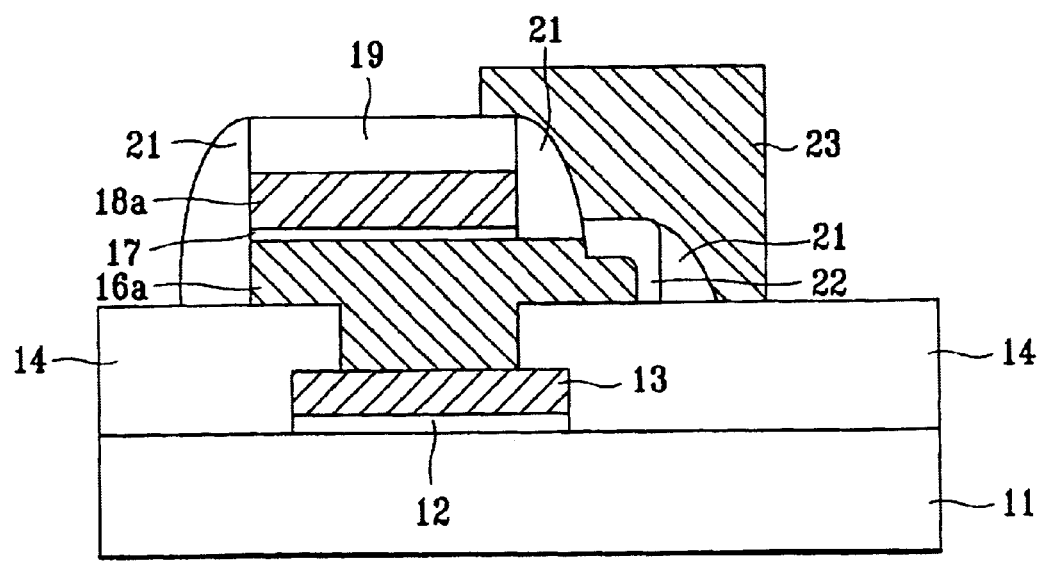
Figure 4:
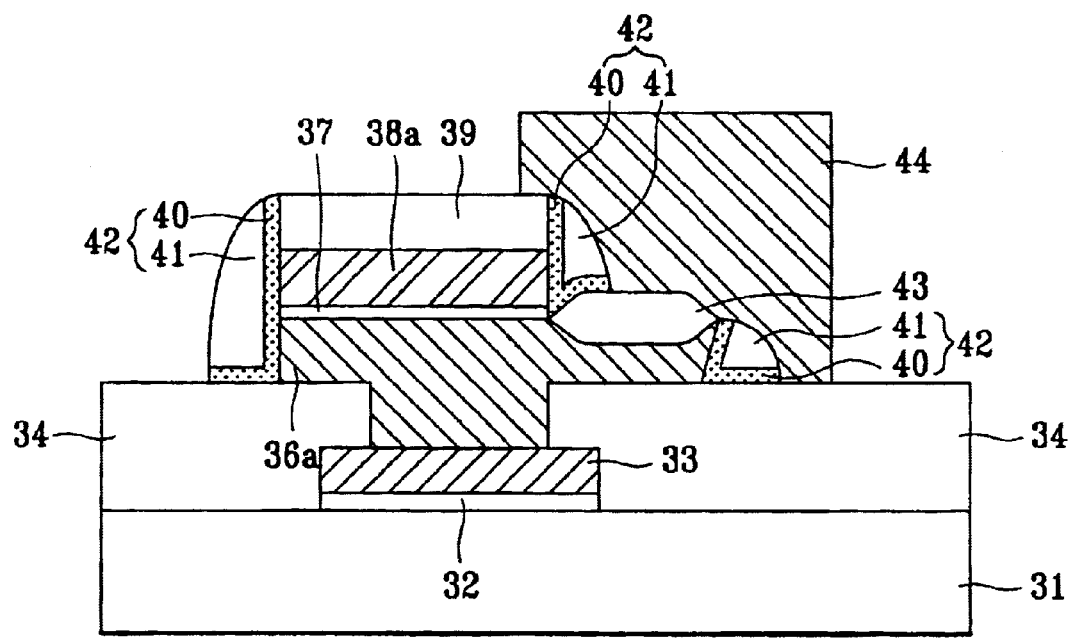
FIG. 4 is a cross sectional view showing the structure of a non-volatile memory device in accordance with the present invention.

FIG. 4 illustrates a cross sectional view showing an exemplary embodiment of a non-volatile memory device in accordance with the present invention. Referring to FIG. 4, the structure of the non-volatile memory device in accordance with the present invention is as follows.

A gate insulation film 32 is formed on a predetermined portion of a semiconductor substrate 31 and a first floating gate 33 is formed on the gate insulation film 32. A first insulation film 34 having a contact hole is formed so as to expose a predetermined surface portion of the first floating gate 33 through the contact hole. A second floating gate 36a is formed in the contact hole and on a part of the first insulation film 34 adjacent to the contact hole. A second insulation film 37, a control gate 38a and a cap insulator 39 are sequentially formed over being aligned with one edge of the second floating gate 36a. A surface at another end of the second floating gate 36a is not covered by the second insulation film 37, the control gate 38a and the cap insulator 39.

Thereafter, sidewall spacers 42 composed of an oxidation resist insulation film 40 and a third insulation film 41 are formed on both sides of the cap insulator 39, the control gate 38a, the second insulation film 37 and the second floating gate 36a. A tunneling insulation film 43 is formed on a surface of the second floating gate 36a, and extends into the lower portion of the sidewall spacer 42. As a result, the tunneling insulation film 43 has horn-like edges or bird's beak at each of its end portions. Due to the tunneling insulation film 43, an end portion of the second floating gate 36a thereunder is also formed to have a horn-like or bird's beak portion. Finally, an erasing gate 44 is formed over the tunneling insulation film 43.

FIG. 5a to FIG. 5i are cross sectional views showing the method for fabricating a non-volatile memory device in accordance with the present invention.

Figure 5A:
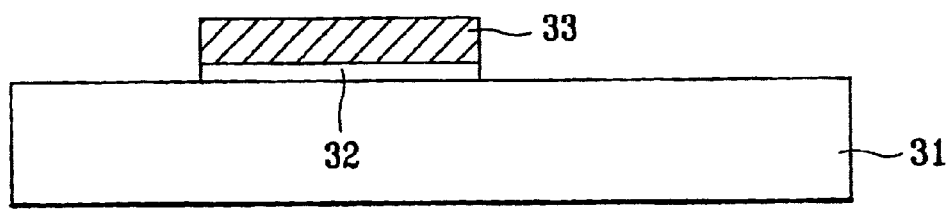
FIG. 5a to FIG. 5i are cross sectional views showing the fabrication method of the non-volatile memory device in accordance with the present invention.

Referring to FIG. 5a, a gate insulation film 32 is formed on a p-type semiconductor substrate 31. A first polysilicon layer for a floating gate is formed on the gate insulation film 32. The first polysilicon layer is selectively removed by a photolithography process so as to form a first floating gate 33 having a predetermined width. The first floating gate 33 is formed as an island shape by patterning the first polysilicon layer in a column direction and then in a direction perpendicular to the column direction by a photolithography process. An insulation film sidewall (not shown in FIG. 5a) is formed on each side of the first floating gate 33 and electrically insulates the floating gate 33. Then, by injecting impurity ions whose conductivity type is different from the conductivity type of the semiconductor substrate 31, the portions of the semiconductor substrate 31 adjacent both sides of the first floating gate 33 form a source region and a drain region (not shown in FIG. 5a), respectively.

Figure 5B:
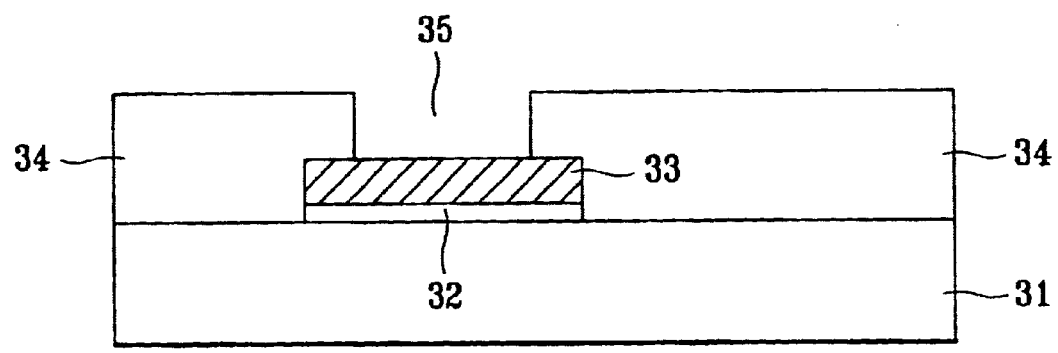

Referring to FIG. 5b, a first insulation film 34 made of an oxide film, an oxide film/nitride film of LPCVD or their combination, is formed over the entire surface of the semiconductor substrate 31 including the first floating gate 33. A contact hole 35 is formed by selectively removing a portion of the first insulation film 34 using a photolithography process so as to expose a predetermined portion of the upper surface of the first floating gate 33.

Figure 5C:
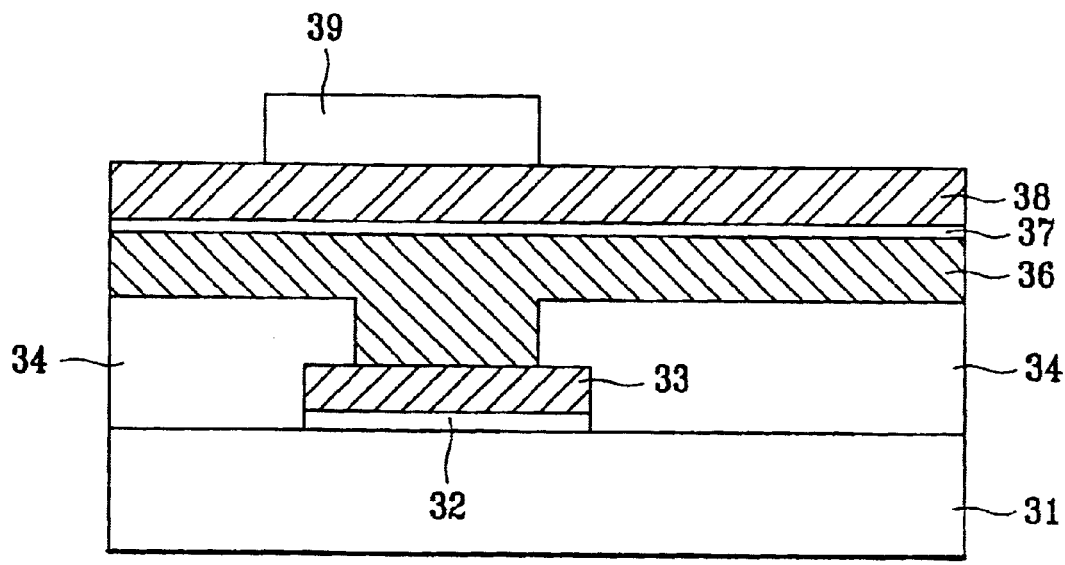

Referring to FIG. 5c, a second polysilicon layer 36 for a second floating gate is formed over the entire surface of the semiconductor substrate 31 including the contact hole 35. In order to form the second polysilicon layer 36, an undoped polysilicon film may be formed and then doped with ion injection or diffusion source, or a doped polysilicon layer may be formed. A second insulation film 37 with a thickness of 100~500 Å composed of a silicon oxide film, or LPCVD oxide film and silicon nitride film or their combination, is formed over the entire surface of the semiconductor substrate 31 including the second polysilicon layer 36. Then a third polysilicon layer 38 for a control gate is formed on the second insulation film 37. Thereafter, a cap insulation film composed of an oxide film, a nitride film or their combination is formed on the third polysilicon layer 38. The cap insulation film is selectively removed by a photolithography process to form a cap insulator 39.

Figure 5D:
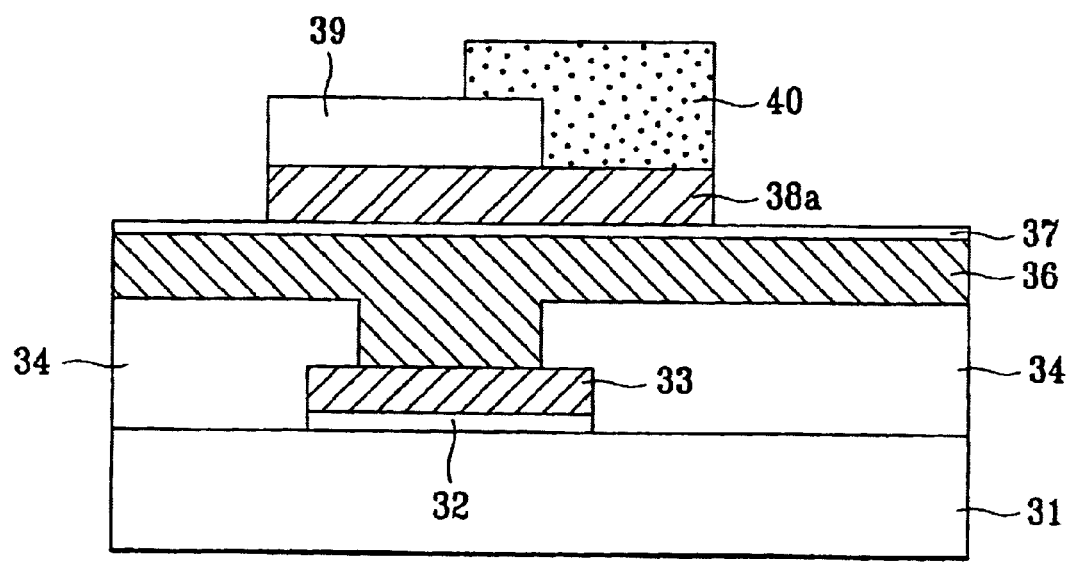

Referring to FIG. 5d, a photo resist is formed over the semiconductor substrate 31 including the cap insulator 39 and then patterned by a process of exposing and developing to form a patterned photo resist 40. Using the patterned photo resist 40 and the cap insulator 39 as a mask, the third polysilicon layer 38 is selectively removed to thereby form a control gate 38a.

Figure 5E:
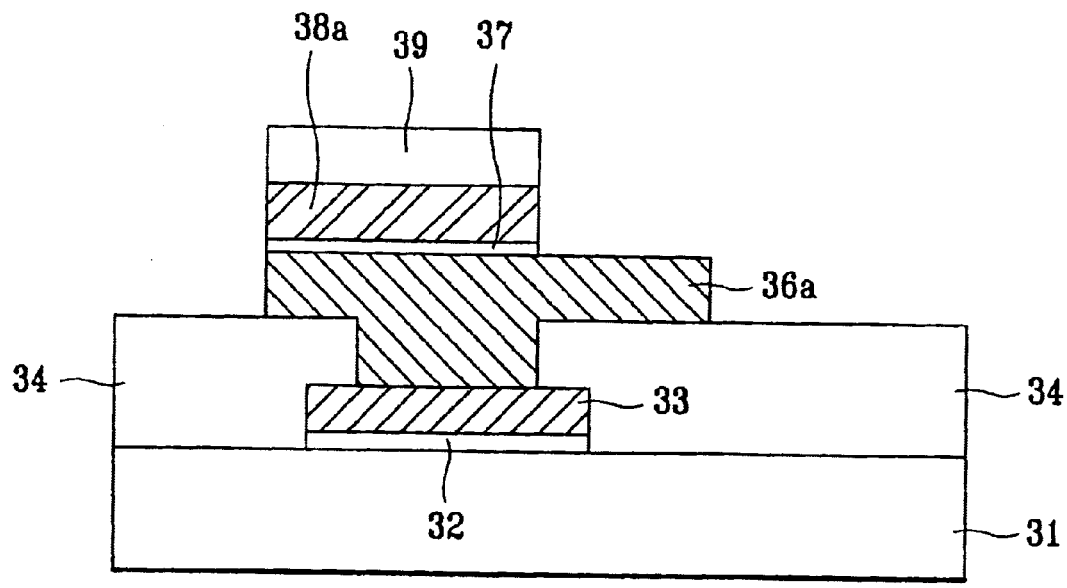

Referring to FIG. 5e, the patterned photo resist 40 is removed and the cap insulator 39 is used as a mask in a blank etching process so as to selectively remove portions of the second insulation film 37 and the second polysilicon layer 36. As a result, a second floating gate 36a is formed. More particularly, as the blank etching is performed, a part of the exposed control gate 38a is selectively removed, and at the same time the second insulation film 37 thereunder is removed so that the control gate 38a and the second insulation film 37 have the same width as the cap insulator 39. Here, the second floating gate 36a is formed so as to have the same width as the original width of the control gate 38a of FIG. 5d. One end portion of the second floating gate 36a is aligned with the second insulation film 37, the control gate 38a and the cap insulator 39. Surfaces of another end portion of the second floating gate 36a is not covered by the second insulation film 37, the control gate 38a and the cap insulator 39.

Figure 5F:
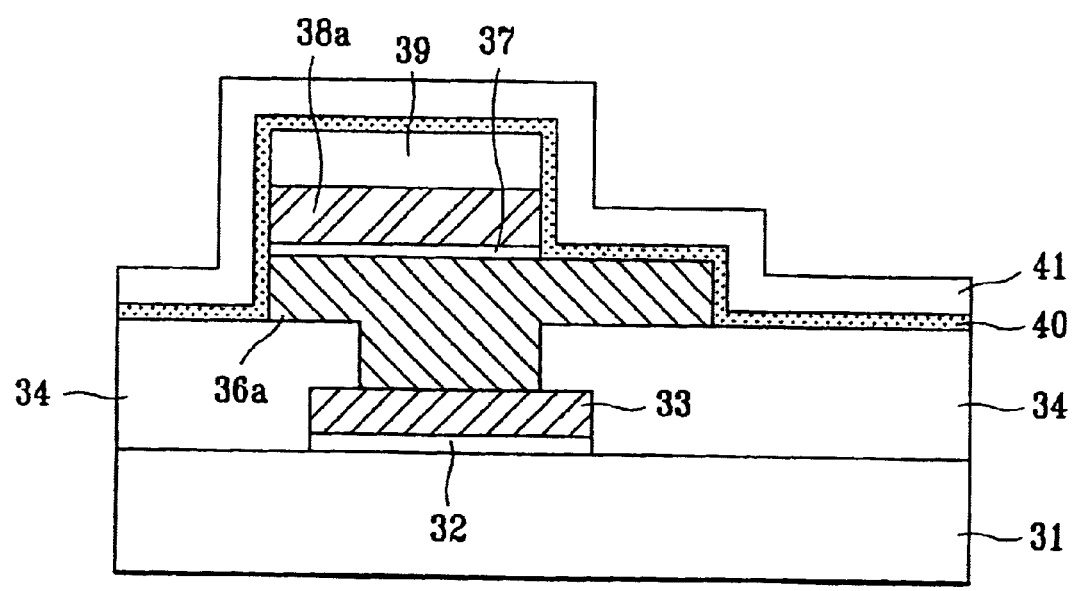

Referring to FIG. 5f, an oxidation resist insulation film 40, e.g., a nitride film, is formed over the entire surface of the semiconductor substrate 31 including the cap insulation film 39. A third insulation film 41, e.g., an oxide film, is formed on the oxidation resist insulation film 40.

Figure 5G:
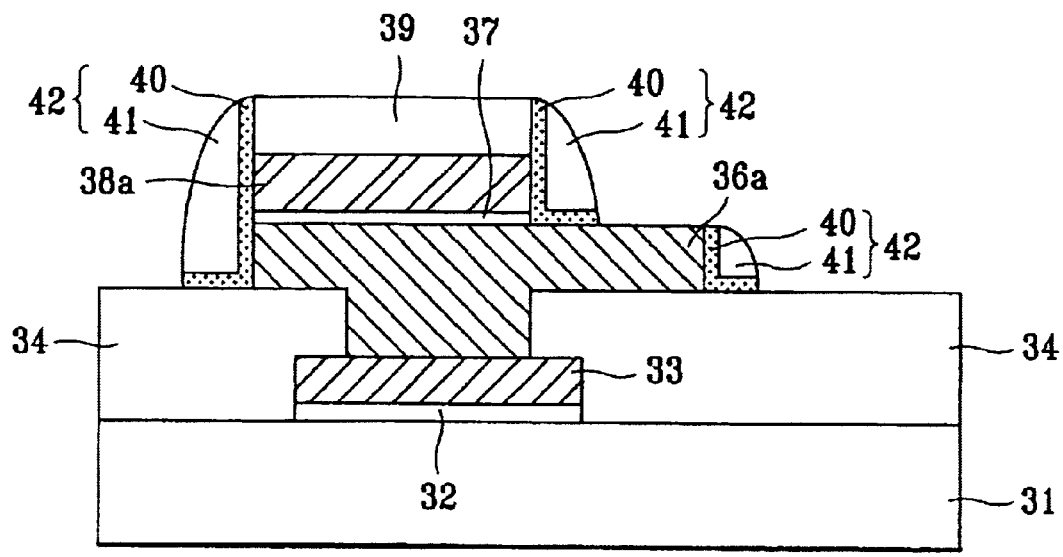

Referring to FIG. 5g, an etch-back process is performed on entire surface of the third insulation film 41 and the oxidation resist insulation film 40, so that sidewall spacers 42 composed of the oxidation resist insulation film 40 and the third insulation film 41 are formed on both sides of the cap insulator 39, of the control gate 38a, of the second insulation film 37 and of the second floating gate 36a.

Figure 5H:
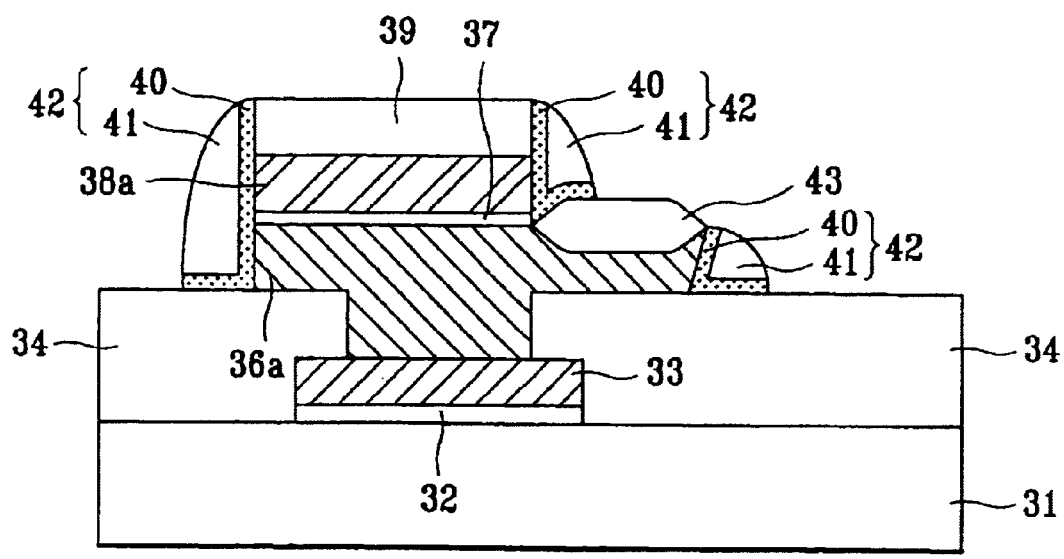

Referring to FIG. 5h, an oxidation process is performed over the surface of the semiconductor substrate 31 to form a tunneling insulation film 43 on the surfaces of the second floating gate 36a which is not covered by the sidewall spacer 42. Here, the oxidation process is similar to the LOCOS (local oxidation of silicon) process that is used for forming a field oxide film for general device separation regions. An edge portion of the tunneling insulation film 43 become a horn-like or bird's beak shape because of the stress exhibited by the oxidation resist insulation film 40 in the sidewall spacers 42. This horn-like or bird's beak shape is generated after a LOCOS process. Accordingly, one end portion of the second floating gate 36a is also formed to have a horn-like or bird's beak shape due to the tunneling insulation film 43 having a horn-like edge formed on the surface of the second portion of the second floating gate 36a.

Because of the shape of the horn-like or bird's beak portion of the second floating gate 36a, charges in the second floating gate 36a easily transfer to an erasing gate when a data erasing operation is performed. As a result, even if the tunneling insulation film 43 is thick, an erasing operation can be performed at a low voltage level.

Furthermore, since the horn-like or bird's beak portion is formed only in one direction at one portion of the second floating gate 36a, unilateral charge transfer is achieved. Thus, undesired charge injection from the erasing gate to the floating gate during a data read operation or a data program operation is prohibited and an advantage is obtained in data retention.

Figure 5I:
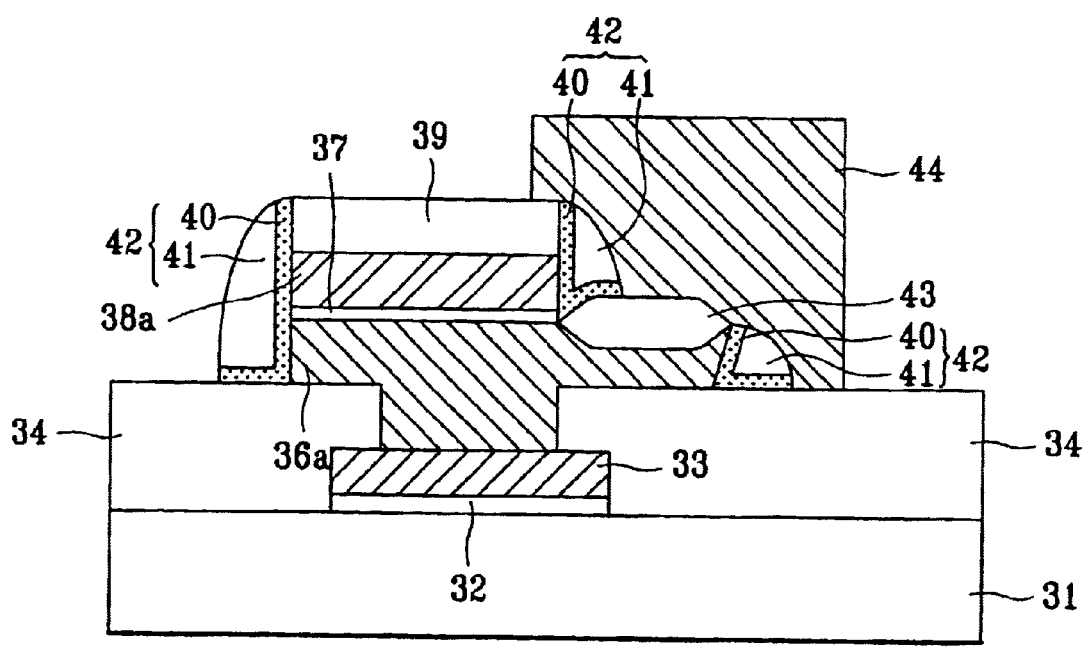

Referring to FIG. 5i, a fourth polysilicon layer for an erasing gate is formed over the entire surface of the semiconductor substrate 31 including the tunneling insulation film 43. The fourth polysilicon film is selectively removed by a photolithography process to form an erasing gate 44 adjacent to the tunneling insulation film 43. The erasing gate 44 is patterned in the same direction as the control gate 36a. A subsequent general process for making electrical contacts and wiring completes the non-volatile memory device.

A data program operation and an erasing operation of the non-volatile memory device in accordance with the present invention will be explained in more detail as follows.

As in the conventional non-volatile memory device, a channel hot injection (CHE) method is used for the program operation and a FN (Fowler-Nordheim) tunneling method based on a voltage of the erasing gate is used for the erasing operation. In other words, when programming the non-volatile memory device, the source and the substrate are grounded, the drain is connected with a voltage (4~6V) and the control gate is driven with a high voltage (6~10V). Under these conditions, the non-volatile memory device operates in its saturation region.

In this case, hot electrons having a high energy are generated in the drain region (the region having a strongest horizontal electric field according to the channel direction). Since the generated hot electrons have high energy, the electrons are injected into the floating gate after tunneling through the gate oxide film by a vertical electric field generated by the gate voltage. The charges injected into the floating gate increases the threshold voltage of the memory device. This CHE injection method is the same as in the conventional non-volatile memory device.

A data erasing operation in the memory device is performed by emitting charges which have been stored in the floating gate into the erasing gate. For this operation, the control gate, the source, the drain and the substrate of the device are grounded and the erasing gate is connected with a high voltage. Therefore, charges stored in the floating gate are tunneled through the insulation film between the floating gate and the erasing gate by the field generated by the erasing gate, and therefrom the charges are removed. If the charges in the floating gate are decreased, the threshold voltage is also decreased.

The voltage of the erasing gate is proportional to the thickness of the tunneling insulation film. However, the structure of the floating gate having the horn-like or bird's beak portion in accordance with the present invention increases the electric field of the erasing gate.

The read operation in the memory device is determined by the amount of charges in the floating gate. If a constant voltage is applied to the control gate, the current flowing in the device is changed according to an amount of charges in the floating gate and the ON/OFF state of the device can be checked by monitoring the current. If the amount of charges in the floating gate is changed during the read operation, a serious data error is generated. In other words, if the erased memory device acquires charges from the erasing gate when the device is in its read operation and then its threshold voltage is changed, then the data stored in the memory device is also changed.

The non-volatile memory device in accordance with the present invention reduces the aforementioned problems. In particular, the horn-like floating gate prevents undesired charge transfer from the erasing gate to the floating gate during the read operation. Also, because of the horn-like structure of the tunneling insulation film between the floating gate and the erasing gate, during the read operation, the possibility for the charges to flow from the erasing gate to the floating gate is very low. However, during the erasing operation, the horn-like tunneling insulation film allows charges to easily transfer from the floating gate to the erasing gate.

Thus, the non-volatile memory device and the fabrication method of the same in accordance with the present invention have the following advantages.

First, because of the floating gate having a horn-like or bird's beak portion, the charges easily flow from the floating gate to the erasing gate and therefore the erasing operation is performed at a low voltage even if the tunneling insulation film is thick. Second, the floating gate having a horn-like or bird's beak portion permits the charge tunneling in one direction and therefore prevents the undesired charge flow from the erasing gate to the floating gate regardless of the operations of the memory device, the read operation or the program operation. Third, when the tunneling insulation film is formed, changes in the profile of the control gate and the floating gate are prevented by the oxidation resist insulation layer.

The forgoing embodiments are merely exemplary and are not to construe as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A fabrication method of a non-volatile memory device comprising:
   forming a floating gate over a semiconductor substrate, the floating gate having a first portion and a second portion;
   forming an intermediate insulator over the first portion of the floating gate, the second portion of the floating gate not covered by the insulator forming a control gate over the intermediate insulator, the second portion of the floating gate not covered by the control gate;

forming sidewall spacers on both sides of the floating gate and the control gate;

forming a tunneling insulator on a surface of the second portion of the floating gate, causing a tapered protrusion to form on the second portion of the floating gate under the tunneling insulator; and forming an erasing gate on the tunneling insulator and above the tapered protrusion of the floating gate.

2. The method of claim 1, wherein the tunneling insulator is formed by performing an oxidation process over the semiconductor substrate using the sidewall spacers as a mask.

3. The method of claim 1, wherein the intermediate insulator is formed by using at least one of a silicon oxide film, a LPCVD oxide film and a silicon nitride film.

4. The method of claim 1, wherein the intermediate insulator is formed to a thickness of 100~500 Å.

5. The method of claim 1, wherein said step of forming the floating gate comprises:

forming a lower floating gate portion over the semiconductor substrate;

forming an insulation film on the lower floating gate portion, the insulation film having a contact hole to expose a predetermined portion of the lower floating gate portion; and forming an upper floating gate portion on the insulation film and in the contact hole, the upper and lower floating gate portions being electrically connected via the contact hole.

6. The method of claim 1, wherein said step of forming the sidewall spacers comprises:

sequentially forming a nitride film and an oxide film over an entire surface of the semiconductor substrate including the control gate and the floating gate; and performing an etch back process on the oxide film and the nitride film so that portions of the oxide film and the nitride film remain on both sides of the control gate and floating gate.

7. The method of claim 1, wherein the tapered protrusion of the floating gate is formed to point towards the erasing gate.

8. A method of forming a non-volatile memory device comprising:

forming a floating gate above the substrate, the floating gate having a first end and a second end, the second end having a tapered portion;

forming a control gate above the first end of the floating gate, the control gate having a first end and a second end;

forming a cap insulator above the control gate, the cap insulator having a first end and a second end;

forming a first sidewall spacer abutting the first end of the floating gate, the first end of the control gate and the first end of the cap insulator;

forming a second sidewall spacer abutting the second end of the control gate and the second end of the cap insulator;

forming a third sidewall spacer abutting the second end of the floating gate;

forming a tunneling insulator on a surface of the second end of the floating gate, the tunneling insulator being between the second and third sidewall spacers; and forming an erasing gate above the tunneling insulator and the second end of the floating gate.

9. The method of claim 8, wherein the first, second and third sidewall spacers are each formed to comprise an inner portion abutting the floating gate, the control gate or the cap insulator, wherein the inner portion being formed of an oxidation resist insulator.

10. The method of claim 9, wherein the first, second and third sidewall spacers are each formed to comprise an outer portion adjacent the inner portion, the outer portion being formed of an oxide insulator.

11. The method of claim 8, wherein the tunneling insulator is formed to have a first end and a second end, the first and second ends being tapered.

* * * * *